United States Patent [19]
Harrison

[11] Patent Number: 5,396,489
[45] Date of Patent: Mar. 7, 1995

[54] METHOD AND MEANS FOR TRANSMULTIPLEXING SIGNALS BETWEEN SIGNAL TERMINALS AND RADIO FREQUENCY CHANNELS

[75] Inventor: Robert M. Harrison, Grapevine, Tex.

[73] Assignee: Motorola Inc., Schaumburg, Ill.

[21] Appl. No.: 966,630

[22] Filed: Oct. 26, 1992

[51] Int. Cl.$^6$ .............................. H04J 4/00
[52] U.S. Cl. ......................... 370/50; 370/70; 370/123; 375/350; 364/724.01; 364/724.1; 364/724.13
[58] Field of Search ............. 370/49.5, 50, 70, 123; 364/724.1, 724.13, 572, 576, 577, 724.01; 375/103

[56]     References Cited
        U.S. PATENT DOCUMENTS

| | | | |
|---|---|---|---|
| 4,316,282 | 2/1982 | Macina | 370/70 |
| 4,785,447 | 11/1988 | Ichiyoshi | 370/70 |
| 4,881,191 | 11/1989 | Morton | 364/724.13 |

OTHER PUBLICATIONS
IEEE Transactions on Communications, vol. COM-22 No. 9, Sep. 1974, "TDM-FDM Transmultiplexer: Digital Polyphase and FFT", Bellanger et al.

Primary Examiner—Douglas W. Olms
Assistant Examiner—Russell W. Blum
Attorney, Agent, or Firm—Richard A. Sonnentag; Jon P. Christensen

[57]             ABSTRACT

A method and apparatus are provided of transmultiplexing a plurality of signals between a plurality of signal terminals (17 or 29) and a plurality of selected radio frequency channels. The method includes the step of, and apparatus for, frequency translating and filtering the plurality signals between the plurality of selected channels and a polyphase discrete Fourier transform filter bank (16 or 21) within a comb filter (15 or 22). The method further includes the step of frequency division multiplexing the plurality of signals between the plurality of signal terminals and comb filter (15 or 22) within a polyphase discrete Fourier transform filter bank (16 or 21).

14 Claims, 4 Drawing Sheets

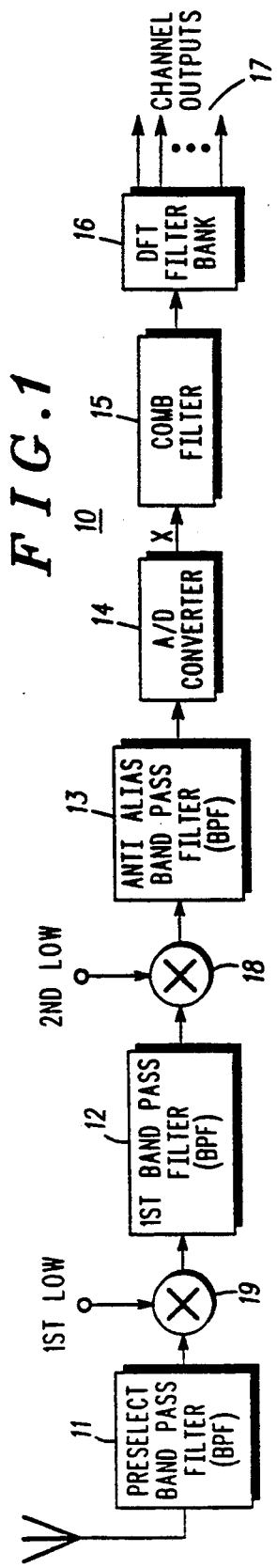
FIG. 1
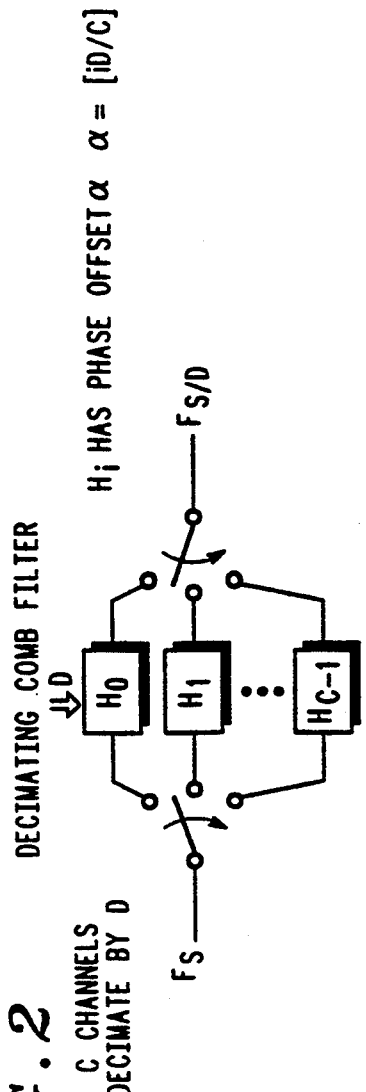
FIG. 2
C CHANNELS DECIMATE BY D
DECIMATING COMB FILTER
$H_i$ HAS PHASE OFFSET $\alpha$  $\alpha = [iD/C]$
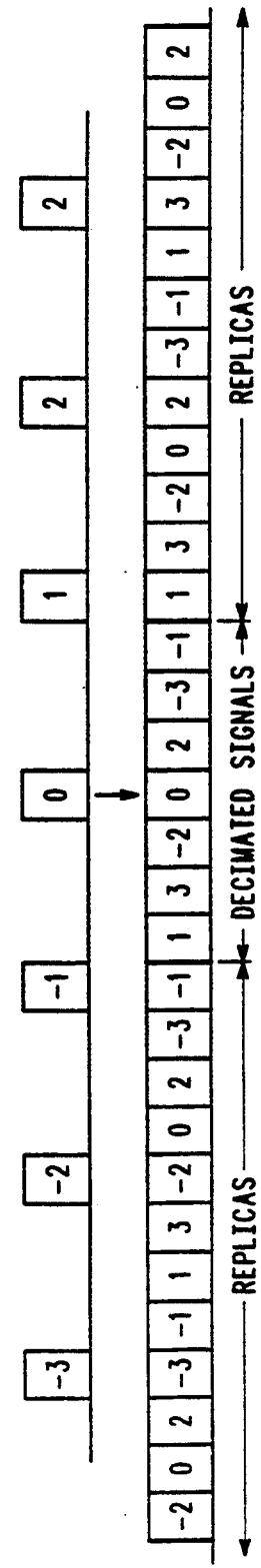

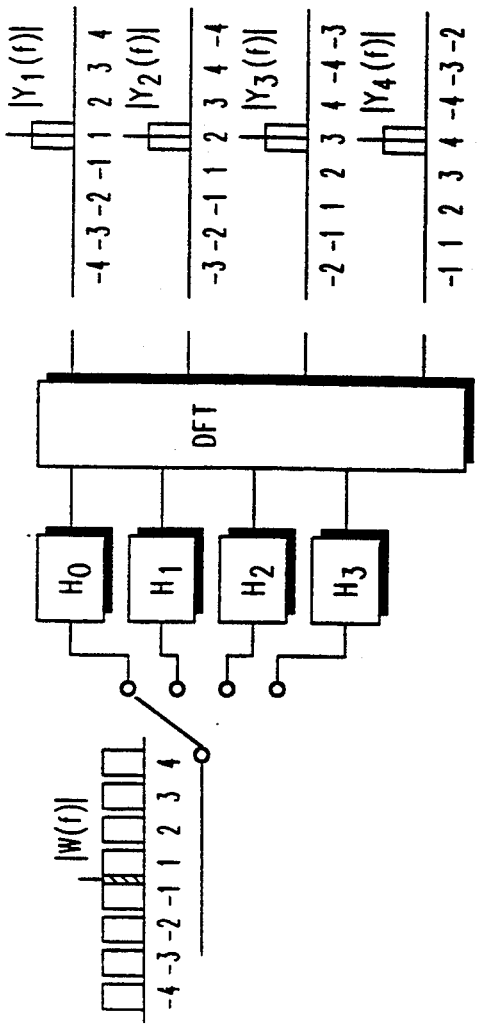
FIG. 3
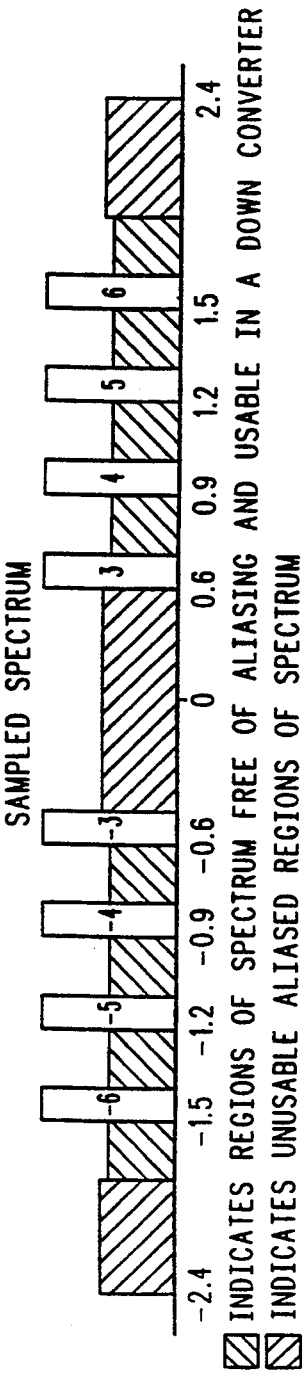
FIG. 4
| SELECTED CHANNEL | 3 | 4 | 5 | 6 |
|---|---|---|---|---|
| FFT OUTPUT No. | 6 | 1 | 12 | 7 |
FIG. 5

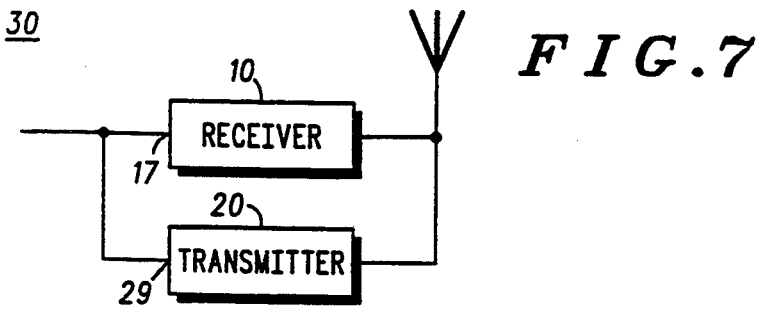
FIG.7
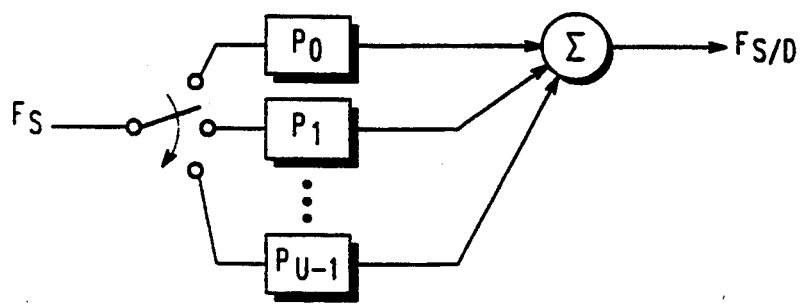
FIG.9
DECIMINATING FILTER WITH PHASE SHIFT
FOR PHASE OFFSET, $\alpha$, START COMMUTATOR AT BRANCH $\alpha$'S INPUT
FIG.10
INTERPOLATING FILTER WITH PHASE SHIFT
FOR PHASE OFFSET, $\alpha$, START COMMUTATOR AT BRANCH 0'S OUTPUT
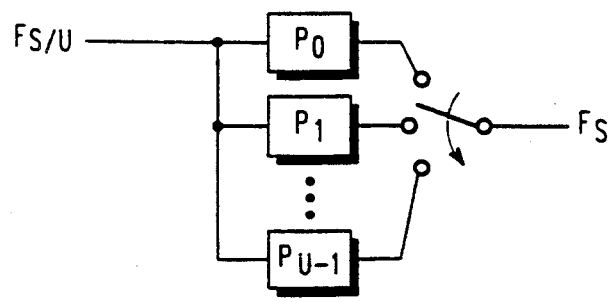

METHOD AND MEANS FOR TRANSMULTIPLEXING SIGNALS BETWEEN SIGNAL TERMINALS AND RADIO FREQUENCY CHANNELS

FIELD OF THE INVENTION

The invention relates to communication systems, and in specific to multichannel transmultiplexing within communication systems.

BACKGROUND OF THE INVENTION

Digital signal processing, and the digital signal processors (DSPs) within which such processing occurs, are known. DSPs are typically used whenever significant numbers of sample parameters must be collected and/or communicated. DSPs in such an environment are used to control sampling and encoding of a signal for storage or transmission to a destination. Although the most familiar uses of such systems lie in the area of voice processing for communications systems, significant applications for such techniques exist in other areas such as geologic surveying or other multi-dimensional data gathering activities.

Use of DSPs in the context of signal gathering and transmission is often limited to a single input signal. Such single input format is convenient because of the complexity of the multi-input data encoding within the transmission channel and also because of the computational complexity of multichannel signal processing within a DSP.

Within the context of a single transmission channel a DSP provides considerable flexibility in adapting to the constraints of the channel. Data samples gathered at a first sampling rate may be reconstructed within the DSP at a second sampling rate without loss of information under the well-known sampling theorem (see pgs. 20-21 of Multirate Digital Signal Processing by Crochiere and Rabiner, Prentice-Hall Inc., 1983).

Where the sampling rate is increased, the values of the increased sampling rate are generated through a process generally referred to as interpolation. As the sampling rate, n, increases (n approaches infinity) a continuous signal (analogous to the originally sampled signal) is generated.

Where the sampling rate is decreased, the process is referred to as decimation. The only limit on decimation is that the sampling rate may not be decreased below twice the highest frequency present in the sampled signal, all in accordance with the familiar Nyquist theorem.

In addition to decimation and interpolation, a bandwidth of a sampled signal may be translated in frequency from a first frequency to a second frequency. As an example, a sampled signal may be frequency translated from a zero-radio frequency (zero-rf) baseband to an appropriate spectrum for transmission through a medium to a destination (see Crochiere and Rabiner, pgs. 48-56).

At a destination, the bandwidth containing the encoded sample stream may, again, be frequency translated to the baseband. At the baseband the sampled information may be recovered directly, or the sampled information may be decimated or interpolated to a more convenient form for the recovery system.

Data streams from multiple sampling sources may also be encoded within a DSP under a multi-channel encoding scheme, translated to a transmission spectrum and transmitted to a destination for decoding. Such a multi-channel encoding scheme is described in Crochiere and Rabiner (Chapter 7) in which a K-channel synthesizer (encoder) and a K-channel analyzer (decoder) are described.

Under the system taught by Crocheire and Rabiner, information is transferred under a channel stacking arrangement that places respective channels, spectrally, in close proximity. Two types of channel stacking are described (odd and even). Channel stacking in either case results in channel spacings in the order of no more than two channels.

While the system taught by Crocheire and Rabiner may be effective as described, such systems are limited in their ability to transcode spectrally diverse signals. Because of the importance of information exchange, a need exists for a method of decoding selected channels that may be widely separated within a transmission spectrum.

SUMMARY OF THE INVENTION

A method and means are provided of transmultiplexing a plurality of signals between a plurality of signal terminals and a plurality of selected radio frequency channels. The method includes the step of, and means for, frequency translating and filtering the plurality of signals between the plurality of non-adjacent channels and a polyphase discrete Fourier transform filter bank within a comb filter. The method further includes the step of frequency division multiplexing the plurality of signals between the plurality of signal terminals and comb filter within a polyphase discrete Fourier transform filter bank.

BRIEF DESCRIPTION OF THE DRAWINGS

FIG. 1 is a block diagram of a receiver in accordance with the invention.

FIG. 2 is a semi-graphical representation of operation of a decimating comb filter in accordance with the invention.

FIG. 3 is a semi-graphical representation of operation of a discrete Fourier transform filter bank in accordance with the invention.

FIG. 4 is a spectral representation of signal processing in accordance with the invention.

FIG. 5 is a conversion table for determination of location of channel outputs of the fast Fourier transform polyphase filter in accordance with the invention.

FIG. 7 is a block diagram of a transceiver in accordance with the invention.

FIG. 9 is a decimating filter with phase shift in accordance with the invention.

FIG. 10 is an interpolating filter with phase shift in accordance with the invention.

DETAILED DESCRIPTION OF THE PREFERRED EMBODIMENT

Figure 6:
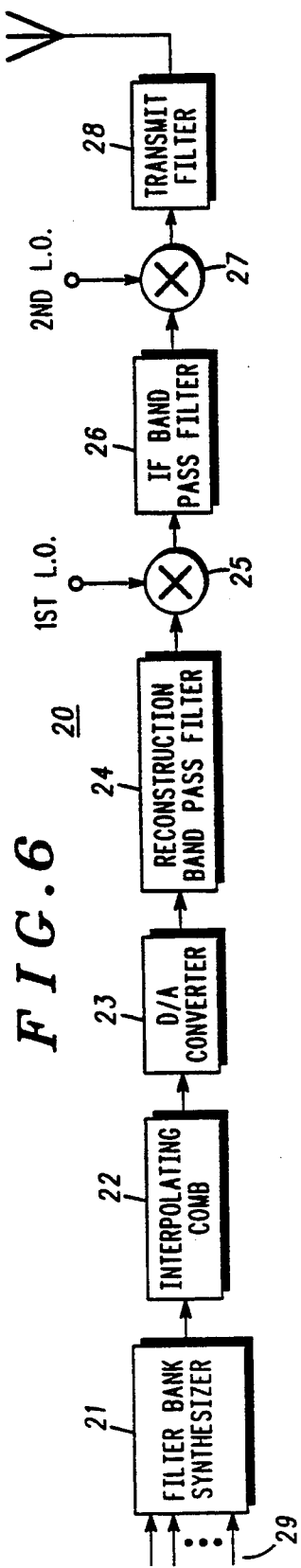
FIG. 6 is a block diagram of a transmitter in accordance with the invention.

The solution to the problem of transmultiplexing between a number of sample streams and selected channels of a transmission spectrum lies, conceptually, in the use of a decimating comb filter in conjunction with a discrete Fourier transform (DFT) filter bank. In the case of a multichannel receiver, the comb filter decimates the selected channels into a frequency division multiplex (FDM) format that may, after further decimation within the DFT filter bank, be resolved into discrete outputs within the DFT filter bank. Likewise in a transmitter, a number of sample inputs may be combined within the DFT filter bank and interpolated to selected channels of a transmission spectrum by further processing within the comb filter.

FIG. 1 is a block diagram of a multichannel receiver (10), generally, in accordance with one embodiment of the invention. Such a receiver (10) may be used in receiving signals on either traffic, or control channels, of a cellular communication system (e.g., the Advance Mobile Phone Service (AMPS) cellular radiotelephone system or of the Narrowband Advance Mobile Phone Service (NAMPS) cellular radiotelephone system available from Motorola, Inc.).

Radio frequency channels selected for use at base sites within the AMPS or NAMPS systems are typically selected under a reuse pattern. Such a reuse pattern reduces co-channel and adjacent channel interference by assigning groups of channels to base sites based upon a geographic and spectral channel separation (e.g., 21 or 24 channels). The receiver (10), in accordance with the invention, receives a selected group of channels, each with a channel separation from the next closest channel, and decodes such channels providing a channel output (17) for each channel of the selected group of channels.

Included with the receiver (10) is an antenna (18), a preselect bandpass filter (preselect BPF) (11), mixers (18-19), IF bandpass filter (IF BPF) (12), anti alias bandpass filter (anti alias BPF) (13), analog-to-digital (A/D) converter (14), comb filter (15), and polyphase discrete Fourier transform filter bank (DFT filter bank) (16). The bandwidths of bandpass filters (11-13) are selected as a function of the number of output channels (17) selected (e.g., if the number of output channels is 4, channel bandwidth is 20 kHz, and every 15 th channel is selected for decoding then the bandpass of BPFs 11-13 is 4 Xs 20 kHz Xs 15=1.2 MHz). For ease in understanding the invention, the number of output channels will be assumed to be four. The reader is reminded, on the other hand, that within certain practical limits the invention may be extended to any number of channels.

Following bandpass filtering in BPFs 11-13 and down converting in mixers 18 and 19, the received signal is sampled within A/D converter 14. The sampling rate within the A/D converter (14) under the Nyquist theorem is assumed to be at least twice the highest frequency of the received signal.

Following sampling within the A/D converter (14) the sampled signal x enters the comb filter (15) where unwanted channels are attenuated by comb filtering. Attenuating the unwanted channels reduces the computational complexity of later steps.

Within the comb filter the selected channels are frequency translated (decimated) (15) into predetermined frequency domain locations (see Multirate Signal Processing, supra, page 32) such as depicted in FIG. 2. As shown channels 0-3 are translated to a baseband location surrounded by replicas on each side. The order of the channels on the output of the comb filter (15) may be computed by examining the effect of decimation on the comb filtered signal as follows:

$$Y(\omega') = 1/D \sum_{q=0}^{D-1} X[(\omega' - 2\pi q)/D]$$

where $\omega'$ is the frequency relative to the decimated sample rate and D is the decimation factor. If the decimation rate and the number of teeth in the comb filter have no common factors, then the sum will have only one non-attenuated term. With only one non-attenuated term, only negligible aliasing energy will be present at the channel corresponding to that term. The location of the frequencies after decimation can be determined by applying the above equation to each frequency of interest, and noting the single frequency which aliases to the desired frequency.

FIG. 2 is a semi-graphical representation of signal processing within the comb filter (15). Within the comb filter (15, FIG. 2) an input sample sequence (x(Ck+i)) is commutated to decimating filters ($H_1$-$H_c$) in a clockwise direction at a first sample rate ($F_s$). Output signals (z), on the other hand, are generated at a second sample rate equal to the first sample rate divided by a decimation factor ($F_s/D$). The decimation factor (D), in accordance with the invention, is equal to the ratio of sample rates before and after decimation.

The output signals (z) are also commutated at the first sample rate divided by the decimation factor. Commutation, on the other hand, does not always follow a unitary incremental progression. A new commutated branch number ($y_1$-$y_c$) of the commutated output (z) is determined based on the identity of the prior commutated branch. The new commutated branch number, in accordance with the invention, is the old branch number plus the decimation factor, modulo the number of branches.

Also shown in FIG. 2 is a graphical representation of decimation of selected channels (0-3) of an input signal (x) to a decimated signal bandwidth an output (z). As shown channels 0-3 are frequency translated from selected frequencies to the decimated signal bandwidth surrounded by replicas of the frequency translated signals.

Signal processing within the decimating comb filter will be represented, generally, through use of the equation as follows:

$$y_i(k) = f(x(Ck+i)),$$

where $y_i$ is the ith commutated filter output, k is a sample interval, "f" indicates the filtering function, x is the input signal, C is the number of selected channels or the number of "teeth" in the comb, i=0 to C-1 and, k=0 to $\infty$. The equation may be further expanded as follows:

$$y_i(k) = \sum_{p=0}^{P-1} a_p(Ck + i - p)$$

where P is the number of coefficients in each comb filter and $a_p$ is the pth comb filter coefficient.

The decimating filters in each branch of the comb filter utilize different decimation phases. More specifically, the decimators in each filter sample at different instants. The filter in branch i has a decimation phase offset, $\alpha$, (in samples) relative to the first branch that can be described by the expression, $\alpha = \{iD/C\}$ (where $\{a\}$ is "greatest integer less than, or equal to, a"). The decimation phase offsets may be better understood by reference to a typical decimation filter (FIG. 9). Such a filter can be derived using methods from Crochiere (supra), chapter 3. The filter's operation is also described in detail in chapter 3 of Crochiere. To obtain a decimation phase offset of $\alpha$ samples, the commutator is simply started $\alpha$ branches from the first branch in a clockwise direction.

The output of the decimating comb filter, designated by the term "z", is defined as follows:

$$z(Ck+i) = y_{iD} \% \; C(Dk + \{iD/C\})$$

where % is modulo division, $\{a\}$ is "greatest integer less than, or equal to, a", and D is the decimation factor.

Shown in FIG. 3 is a semi-graphical representation of signal processing occurring within the DFT filter bank (16). As shown an input sample sequence containing a number of FDM passbands is commutated to a set of filters ($h_o$–$h_3$). The outputs of the filters ($h_o$–$h_3$) is then subjected to a discrete Fourier transform resulting in independent channel outputs (1–4). Signal processing within the DFT filter bank (16) may be represented at each of the outputs as follows:

$$y_i(k) = f_i(x(Ck+i))$$

where $y_i(k)$ represents the ith commutated filter output ($h_o$–$h_3$), $f_i$ indicates filtering within the ith filter, x is the DFT filter bank (16) input, i=0 ... C-1, and k=0 ... $\infty$. The expression, $y_i(k)$, may be further expanded as follows:

$$y_i(k) = \sum_{p=0}^{P-1} a_p^i (Ck + i - p)$$

where $a_p^i$ is the pth coefficient of the ith polyphase filter. The outputs ($z_i(k)$) of the DFT filter bank (16) are described in terms of inputs as follows:

$$z_i(k) = \sum_{p=0}^{C-1} y_p(k) e^{-j2\pi pi/C}$$

As an example, a communication system is designed that has four 20 kHz wide channels, and every 15th channel is used (300 kHz separation between "selected" channels). Between each of the 20 kHz channels (selected and unselected), a guard band separates channels by 3 kHz. The guard band results in a useful bandwidth extending ±7 kHz from each side of channel center.

A receiver operating within such a system must sample the signal (with an analog-to-digital (A/D) converter) at the Nyquist rate of the highest frequency channel. The A/D, on the other hand, can't realistically sample at the Nyquist rate, since the anti alias filter must have a nonzero transition band between a filtered region and a non-filtered region. (A typical sample rate which accounts for anti alias filter rolloff is 4 times the bandwidth of the desired signal.) Since the example system has four 20 kHz channels separated by 300 kHz, oversampling by 4 suggests an A/D rate of $F_s$=4.8 MHz ($4 \times 15 \times 4 \times 20$ kHz).

A typical spectrum where the center of the desired channels is mixed to $F_s/4$ is shown in FIG. 4. In the spectrum shown the center of the bandwidth is 1.2 MHz and has upper and lower bandlimits of 0.6 and 1.8 MHz, respectively. Within such a spectrum, channels 3–6 are the channels to be decoded (the desired channels).

Other channels (1–2 and >7) are in areas where aliasing would make signal recovery difficult.

The comb/DFT filter bank combination must be able to separate and downconvert at least the 4 positive frequency portions of the desired channels. To do so the combination must be able to discern spectra which are 300 kHz ($F_s/16$) apart (channel separation of selected channels). To discern spectra which are 300 kHz apart the DFT filter bank and comb must have a resolution of $F_s/16$.

The comb filter may be viewed as an upsampled low pass filter. As such, it may be constructed by designing a low pass filter prototype which matches the desired shape of each tooth in the comb. In the example system, the sample rate is 4.8 MHz. Since there are 4 channels of interest, and the A/D oversampling rate is 4, the upsample rate (or number of "teeth" in the comb filter) is $4 \times 4$ or 16. From the upsample rate the bandwidth of each comb tooth can be determined by dividing the bandwidth ($F_s$) by the upsample rate (16) to provide a result of 300 kHz. The lowpass prototype is therefore designed with a sample rate of 300 kHz.

The decimation rate of the comb filter is selected with a value of 5. The comb filter, therefore, reduces the bandwidth of each tooth by 5. To avoid aliasing, the lowpass prototype must cut off at one-fifth the input Nyquist rate (30 kHz). The signal of interest extends to 7 kHz, so a transition band can extend no further than from 7–30 kHz. The normalized transition bandwidth is, therefore, $\Delta F = 23$ kHz/300 kHz = 0.0767.

The comb filter coefficients may be obtained based upon the above parameters. A first filter order may be obtained by using the order required in a Kaiser windowed design. For a Kaiser window, the order is: $O = (\text{stop} - 7.95)/(14.36 \Delta F) + 1$, where "stop" is the stop band attenuation in dB (50), and $\Delta F$ is the normalized transition bandwidth (0.0767). Substituting, a filter order of O=39 is provided. Given the start, stop, and transition bands, as well as the filter order, any number of lowpass filter design procedures may be used.

One of the most popular design procedure is the Remez exchange procedure found in many software packages (e.g., the Matlab Signal Processing Tool Box, by Math Works Inc., Natick, Mass.). Using the Matlab software a filter is designed for the example using as an input the expression "f=remez(39,[0 7/150 30/150 1],[1 1 0 0];" (see the Matlab manual for details of parameter entry). If, based upon results provided, the stopband performance is excessive (inadequate) the filter order may be raised (or lowered) until an acceptable filter is provided.

The polyphase filter designs are also derived from low pass prototypes, but are a bit more elaborate. In the case of the polyphase filter, on the other hand, the prototype low pass filter is designed and then decimated by the number of points in the FFT to form the different polyphase filters for each channel input. The number of points in the FFT is equal to the number of branches in the comb filter.

Using the previously designed comb filter, the polyphase DFT filter bank would have an input sample rate ($F_{comb}$) of $F_{comb} = Fs/5 = 960$ kHz. Such rate is a determination of the output sample rate of the comb filter (above). Again, the desired signal extends to 7 kHz, which determines the cut-off frequency of the filter. The stop band must begin no further than the Nyquist rate of each channel (10 kHz), so the transition band is 3 kHz. Using the Kaiser windowed design procedure, the filter order is: O=(stop-7.95)/(14.36/ΔF)+1=938. It is convenient to have the polyphase filters be identically sized, which requires that the filter order be a multiple of the number of FFT points. To this end, the order is set to (59 Xs 16)−1=943. (Note that there are 944 coefficients in a filter with order 943.) The Remez subroutine call in Matlab has the expression "f=remez(943,[0 7/480 10/480 1], [1 1 0 0]);"

Each of the 16 different polyphase filters (corresponding to the 16 inputs of the FFT) can be obtained by decimating the prototype low pass filter and retaining the coefficients of each decimated phase. An example program for the Matlab software is as follows:

```
N=59
M=16
rho=zeros(N,M);
for i=0:M
    k=1:N
        rho(k,i+1)=f(k*m−i)
    end
end
``` where N is the order of each polyphase filter, M is the number of points in the FFT, rho is the matrix of polyphase filter coefficients, i is each filter coefficient decimated by M at a different phase for each filter.

In evaluating the location of channels (input versus output) the (above) expression, $Y(\omega')$, is used. The comb reorders the input spectrum, so the FFT output ordering and the channel ordering are generally not the same. By applying the comb decimation equation, it can be determined that channels 3 through 6 correspond to the FFT outputs listed in FIG. 5. (Note that the first FFT output is labeled 0, and the last labeled 15.) Since only 4 of the 16 FFT outputs are useful channels, only the 4 need be computed. The downconverter which produces the four channels are diagrammed in FIG. 5.

While the examples offered provide an insight into construction of a receiver in accordance with the invention, it should be apparent to those of skill in the art that such a process can be easily adapted to construction of a transmitter using a polyphase filter bank and comb filter. FIG. 6 is a transmitter, (20) generally, in accordance with the invention. Included within the transmitter (20) is a DFT filter bank synthesizer (21), an interpolating comb filter (22), a digital-to-analog converter (23), a reconstruction bandpass filter (24), mixers (25 and 27), an IF bandpass filter (26), and a transmit filter (28).

Such a transmitter (20) receives a number of signals on input terminals (29) and frequency translates input signals ($Y_1$-$Y_4$) shown in the right of FIG. 3 to bandpass locations shown in the frequency domain graph on the left of FIG. 3 within the polyphase filter bank synthesizer (21). (In the preferred embodiment the polyphase filter bank synthesizer (21) is realized using an inverse fast Fourier transform instead of a FFT.) Included with the bandpass signals of FIG. 3 are replicas of translated signals (not shown in FIG. 3).

Figure 8:
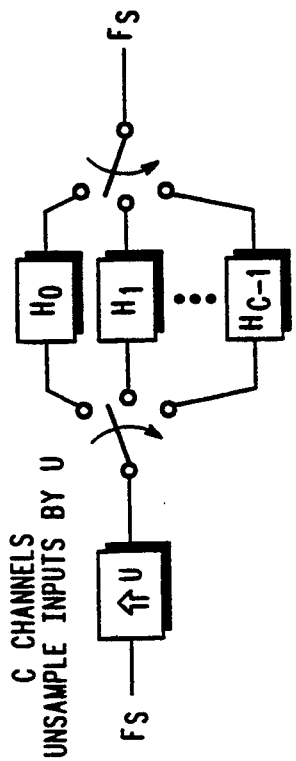
FIG. 8 is a semigraphical representation of signal processing within an interpolating comb filter in accordance with the invention.

The replicas of the translated signals are attenuated within the interpolating comb filter (22) before frequency translation to selected frequencies of a transmission spectrum. Such a process may be depicted by the semi-graphical representation of FIG. 8. In FIG. 8 signals (0-3) and replicas (0-3) (z) from the polyphase filter bank synthesizer (21) are commutated to filters ($H_1$-$H_C$) where replicas (0-3) are attenuated and desired channels are frequency translated.

The interpolating filters in an interpolating comb utilize different interpolating phases. They have the same offsets ($\alpha$) according to branch number as the decimating filters discussed above and as shown in the expression, $\alpha = \{iD/C\}$ (where $\{a\}$ is "greatest integer less than, or equal to, a"). The interpolation phase offsets may be better understood by reference to a typical interpolating filter (FIG. 10). Polyphase interpolation filters are described in chapter 3 of Crochiere. To obtain an interpolation phase offset of $\alpha$ samples, the commutator is simply started $\alpha$ branches from the first branch in a clockwise direction.

The general form of signal processing within the interpolating comb filter would have the form as follows:

$$y_{iU\%C}(n) = \begin{cases} x(Ck + i); & n = Uk + \{iU/C\} \\ 0; & \text{else} \end{cases}$$

where i=0 to C-1, k=0 to ∞, j=0 to C-1, n=0 to ∞, x is comb filter output, y is the input to the ith branch of the comb, U is the interpolation rate of the comb, C is the number of channels, or the number of "teeth" in the comb, n is the time index at the output of any comb filter branch, which is also the number of times the output commutator has passed over all branches of the comb, % is modulo division, {b} is "greatest integer less than, or equal to, b", and k is the number of times the input commutator has put a sample in each branch of the comb.

The equation can be solved for a comb filter output, z, as follows:

$$z(Cn+j) = f(y_j(n))$$

where f is filtering. The equation may be further expanded as follows:

$$z(Cn + j) = \sum_{m=0}^{N-1} a_m y_j(n - m)$$

where $a_m$ is the mth coefficient of the comb filter and N is the number of coefficients in each of the comb filters.

It should also be apparent that the receiver (10) and transmitter (20) can be combined to create a transceiver (30) shown generally in FIG. 7. Such a transceiver (30) would exchange signals between signal terminals (17 and 29) and selected channels of a transmission spectrum through use of the polyphase filter and comb filter arrangements previously described.

I claim:

1. A method of multiplexing a plurality of signals between a plurality of signal terminals and a plurality of selected radio frequency channels, such method comprising the steps of: frequency translating and filtering the plurality or signals within a comb filter between the plurality of selected channels and a discrete Fourier transform filter bank; and frequency division multiplexing the plurality of signals within the discrete Fourier transform filter bank, wherein said signal terminals are coupled to the discrete Fourier transform filter bank.

2. The method as in claim 1 further including the step of encoding a plurality of signals between the plurality of signal terminals and the plurality of selected channels using a polyphase discrete Fourier transform filter bank as the discrete Fourier transform filter bank and an interpolating comb filter as the comb filter.

3. The method as in claim 1 further including the step of decoding a plurality of output signals between the plurality of selected channels to the plurality of signal terminals using a polyphase discrete Fourier transform filter bank as the discrete Fourier transform filter bank and an interpolating comb filter as the comb filter.

4. An apparatus for multiplexing a plurality of signals between a plurality of signal terminals and a plurality of selected radio frequency channels, such apparatus comprising: means for frequency translating and filtering the plurality of signals within a comb filter between the plurality of selected channels and a discrete Fourier transform filter bank; and means for frequency division multiplexing the plurality of signals within, the discrete Fourier transform filter bank, wherein said signal terminals are coupled to the discrete Fourier transform filter bank.

5. The apparatus as in claim 4 further comprising means for encoding a plurality of signals between the plurality of signal terminals and the plurality of selected channels using a polyphase discrete Fourier transform filter bank as the discrete Fourier transform filter bank and an interpolating comb filter as the comb filter.

6. The apparatus as in claim 4 further comprising means for decoding a plurality of output signals between the plurality of selected channels to the plurality of signal terminals using a polyphase discrete Fourier transform filter bank as the discrete Fourier transform filter bank and an interpolating comb filter as the comb filter.

7. A method of decoding a plurality of selected radio frequency channels within a receiver, such method comprising the steps of: frequency translating and filtering the radio channels using a decimating comb filter; and producing a plurality of output signals, at a plurality of respective outputs, by filtering the output of the decimating comb filter using a polyphase discrete Fourier transform filter bank.

8. The method of claim 7 further including the step of operating the decimating comb filter using a first decimation factor.

9. The method of claim 8 further including the step of operating the polyphase discrete Fourier transform filter bank using a second decimation factor.

10. The method of claim 9 wherein the product of the first and second decimation factors substantially equals a channel spacing of the selected channels.

11. An apparatus for decoding a plurality of selected radio frequency channels within a receiver, such apparatus comprising: means for frequency translating and filtering the radio channels using a decimating comb filter; and means for producing a plurality of output signals, at a plurality of respective outputs, by filtering the output of the decimating comb filter using a polyphase discrete Fourier transform filter bank.

12. The apparatus of claim 11 further comprising means for operating the decimating comb filter using a first decimation factor.

13. The apparatus of claim 12 further comprising means for operating the polyphase discrete Fourier transform filter bank using a second decimation factor.

14. The method of claim 13 wherein the product of the first and second decimation factors substantially equals a channel spacing of the selected channels.

* * * * *